(12) United States Patent
Shizukuishi

(10) Patent No.: US 7,256,830 B2
(45) Date of Patent: Aug. 14, 2007

(54) SOLID-STATE IMAGING DEVICE AND MANUFACTURING METHOD FOR SOLID-STATE IMAGING DEVICE

(75) Inventor: Makoto Shizukuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 812 days.

(21) Appl. No.: 10/438,331

(22) Filed: May 15, 2003

(65) Prior Publication Data

US 2003/0214598 A1 Nov. 20, 2003

(30) Foreign Application Priority Data

May 16, 2002 (JP) .............................. 2002-141155

(51) Int. Cl.
*H04N 3/14* (2006.01)
(52) U.S. Cl. ..................................... 348/315
(58) Field of Classification Search ................ 348/315, 348/311, 324; 358/483; 257/222, 225, 226, 257/231; 250/208.1
See application file for complete search history.

(56) References Cited

U.S. PATENT DOCUMENTS

| 5,406,331 | A  | * | 4/1995  | Barrett ....................... 348/317 |
| 6,236,434 | B1 | * | 5/2001  | Yamada ...................... 348/315 |
| 6,528,831 | B2 | * | 3/2003  | Umetsu et al. ............. 257/250 |
| 6,806,904 | B1 | * | 10/2004 | Kim ............................. 257/232 |
| 6,822,682 | B1 | * | 11/2004 | Kawajiri et al. ............ 348/315 |
| 7,091,464 | B2 | * | 8/2006  | Murayama et al. ........ 250/208.1 |
| 7,125,740 | B2 | * | 10/2006 | Yamane et al. ......... 348/E3.021 |
| 7,154,549 | B2 | * | 12/2006 | Shizukuishi ................ 348/315 |

| 2002/0024071 | A1 | * | 2/2002  | Kawajiri et al. ............ 257/292 |
| 2002/0054227 | A1 | * | 5/2002  | Hashimoto .................. 348/311 |
| 2002/0075391 | A1 | * | 6/2002  | Shizukuishi ................ 348/319 |
| 2002/0085103 | A1 | * | 7/2002  | Kondo et al. ............... 348/315 |
| 2002/0154235 | A1 | * | 10/2002 | Kim ............................. 348/311 |
| 2003/0151075 | A1 | * | 8/2003  | Shizukuishi ................ 257/225 |

FOREIGN PATENT DOCUMENTS

JP        09-051485        2/1997

OTHER PUBLICATIONS

Tetsuo Yamada, et al.; "A Progressive Scan CCD Image Sensor for DSC Applications"; Dec. 2000; IEE Journal of Solid-State Circuits, vol. 35 No. 12.

* cited by examiner

*Primary Examiner*—Lin Ye
*Assistant Examiner*—Jason Whipkey
(74) *Attorney, Agent, or Firm*—Arent Fox LLP

(57) ABSTRACT

A solid-state imaging device comprises a semi-conductor substrate demarcating a two-dimensional surface, a multiplicity of photoelectric conversion units formed at grid points of a first grid of a first tetragonal matrix and a second tetragonal matrix having grid points between grid points of the first tetragonal matrix, a vertical transfer channel arranged in a vertical direction by weaving a space between the horizontally adjacent photoelectric conversion units, a plurality of single-layered electrodes formed above the vertical transfer channel and arranged in a horizontal direction by weaving a space between the vertically adjacent photoelectric conversion units, and a signal processor having a gate electrode and formed, in correspondence to the vertical transfer channel, at one end of the vertical transfer channel on the semiconductor substrate. A low power consuming solid-state imaging device can be provided.

8 Claims, 9 Drawing Sheets

SOLID-STATE IMAGING DEVICE AND MANUFACTURING METHOD FOR SOLID-STATE IMAGING DEVICE

CROSS REFERENCE TO RELATED APPLICATION

This application is based on Japanese Patent Application 2002-141155, filed on May 16, 2002, the entire contents of which are incorporated herein by reference.

BACKGROUND OF THE INVENTION

A) Field of the Invention

This invention relates to a solid-state imaging device, more particularly to a solid-state imaging device having a CCD-type transfer channel.

B) Description of the Related Art

FIG. 9 is a block diagram showing a structure of a conventional four-phase drive (φ1-φ4) charge coupled device (CCD) type solid-state imaging device 52 according to the prior art.

The solid-state imaging device 52 has an image area 60a, a multiplicity of photodiodes 62 arranged in a tetragonal matrix, and a vertical charge coupled device (VCCD) 64 arranged in correspondence with each column of the photodiodes. The VCCD 64 has a multi-layered electrode structure as described later.

At one end of the image area 60a, a horizontal charge coupled device (HCCD) 60b is configured. The HCCD 60b also has a multi-layered electrode structure similar to the VCCD 64. Following the HCCD 60b, an output amplifier 55 consisted of a high-speed analogue amplifier is configured.

Signal charges stored in the photodiodes 62 are transferred to the VCCD 64 simultaneously, and thereafter the VCCD 64 transfers the signal charges in a vertical direction in order. The signal charges transferred by the VCCD 64 are transferred in a horizontal direction row by row by the HCCD 60b and are output to the later-described analogue signal processing circuit 53 (FIG. 11) after being amplified by the output amplifier 55.

The output amplifier 55 is formed, for example, by including a charge/voltage (Q/V) converter consisted of a floating diffusion amplifier (FDA) and a source follower circuit.

Generally, the HCCD 60b transfers the signal charges by using high-speed transfer pulse over 14 MHz or over, and so power consumption of the HCCD 60b is high. The power consumption of the HCCD 60b counts about 40% of a total power consumption of the solid-state imaging device 52. Moreover, power consumption of the output amplifier 55 also counts about 40% of the total power consumption of the solid-state imaging device 52. Therefore, in the solid-state imaging device 52 according to the prior art, sum of the power consumption of the HCCD 60b and the output amplifier 55 counts about 80% of the total power consumption.

FIG. 10 schematically shows a structure of a double-layered poly-silicon electrode that is an example of the multi-layered electrode structure according to the prior art.

The VCCD 64 is formed, for example, by including a vertical transfer channel 614 made of an n-type impurity doped region formed on a p-well 611b of a semiconductor substrate 611a, an oxide film 615a formed on the vertical transfer channel 614, a first layer poly-silicon electrode 616a formed on the oxide film 615a, an inter-layer insulating film 615b formed by oxidizing the first layer poly-silicon electrode 616a, and a second layer poly-silicon electrode 616b formed on the inter-layer insulating film 615b and overlapping edge portions of the first layer poly-silicon electrode 616a.

In the multi-layered electrode structure wherein the first layer poly-silicon electrode 616a and the second layer poly-silicon electrode 616b are laminated with placing the inter-layer insulating film 615b therebetween, the inter-layer insulating film 615b is formed by oxidizing a surface of the first layer poly-silicon electrode 616a. At a time of the oxidation, a Si surface exposing under the oxide silicon layer is also slightly oxidized. A film thickness of the oxide film 615a under the second layer poly-silicon electrode 616b will be thinner than a film thickness of the oxide film 615a under the first layer poly-silicon electrode 616a, and therefore, difference in the film thickness will be occurred.

In order to reduce an effect of the film thickness difference at the largest extent, the film thickness of the oxide film 615a has to be thick in advance. By making the film thickness thick, drive voltage of the electrode will be high. This point is a common feature of forming an inter-layer insulating film between laminated electrodes like the double-layered poly-silicon electrode shown in the drawing, a triple-layered poly-silicon electrode or the likes.

FIG. 11 is a block diagram showing a structure of an imaging system of a digital camera using an analogue output solid-state imaging device.

In an imaging system of a digital camera using a conventional solid-state imaging device, for example, an analogue signal processing circuit 53, an analogue/digital converter (ADC) 54, a digital signal processing circuit 63, a system controlling unit 5 and a storage medium 6 are connected to a bus line 7.

A solid-state imaging device 52 is, for example, a CCD type solid-state imaging device shown in FIG. 9. The solid-state imaging device 52 is connected to the analogue signal processing circuit 53 and supplies signal charges to the analogue signal processing circuit 53.

The system controlling unit 5 controls operations of the analogue signal processing circuit 53, the ADC 54, the digital signal processing circuit 63, a DRAM 4, and the storage medium 6, all of which are connected to the bus line 7.

Signal charges read from the solid-state imaging device 52 at a high-speed is supplied to the analogue signal processing circuit 53. The analogue signal processing circuit 53 is consisted of, for example, a noise-eliminating unit made of a correlated double sampling circuit, a color signal processing circuit, etc.

The ADC 54 converts analogue voltage signals into digital signals row by row and outputs them to the digital signal processing circuit 63. The digital signal processing circuit 63 can stores the input digital signals into the DRAM 4 row by row. Also, the digital signal processing circuit 63 reads the digital signals stored in the DRAM 4 and executes various image signal processes such as JPEG compressing and decompressing, etc. Moreover, the digital signal processing circuit 63 outputs the image signal processed digital signals to a monitor and stores them into the storage medium 6.

In addition to the above-described CCD type solid-state imaging device, there is a so-called frame interline transfer (FIT)-CCD having a charge storage region formed at one end of an image area. In the FIT-CCD, charge signals are transferred vertically at a high-speed and stored temporarily into the charge storage region formed at one end of an image area before being transferred horizontally. The high-speed charge transfer of the vertical charge coupled devices (VCCD) in the FIT-CCD can reduce smear noise of a CCD image sensor.

As described in the above, about 80% of the total power consumption of the conventional CCD type solid-state imaging device 52 is used by the HCCD 60b and the output amplifier 55. For increasing the number of pixels, further high-speed driving of the HCCD 60b and the output amplifier 55 will be necessary, and the power consumption will become higher.

In order to reduce the power consumption due to the high-speed driving, there is a CCD type solid-state imaging device having two HCCDs for doubling a transfer rate at the same transfer clock frequency.

Also, the above-described FIT-CCD used a multi-layered poly-silicon electrode, it was difficult to drive a VCCD at a high-speed because of high resistance of poly-silicon. Although a metal lining structure is applied in order to lower the resistance, the FIT-CCD is used for a limited purpose such as a broadcasting system or the likes because of its difficulty in manufacturing and miniaturization. Moreover, the FIT-CCD consume higher power than a normal CCD due to higher driving speed.

SUMMARY OF THE INVENTION

It is an object of the present invention to provide a CCD type solid-state imaging device with low power consumption.

Also, it is another object of the present invention to provide a CCD type solid-state imaging device with an on-chip peripheral circuit that can be easily manufactured and a method for easily manufacturing the CCD type solid-state imaging device with an on-chip peripheral circuit.

Moreover, it is further object of the present invention to provide a FIT-CCD type solid-state imaging device that can be easily manufactured and miniaturized.

According to one aspect of the present invention, there is provided a solid-state imaging device, comprising: a semi-conductor substrate demarcating a two-dimensional surface; a multiplicity of photoelectric conversion units formed at grid points of a first grid of a first tetragonal matrix and a second tetragonal matrix having grid points between grid points of the first tetragonal matrix; a vertical transfer channel arranged in a vertical direction by weaving a space between the horizontally adjacent photoelectric conversion units; a plurality of single-layered electrodes formed above the vertical transfer channel and arranged in a horizontal direction by weaving a space between the vertically adjacent photoelectric conversion units; and a signal processor having a gate electrode and formed, in correspondence to the vertical transfer channel, at one end of the vertical transfer channel on the semiconductor substrate.

According to another aspect of the present invention, there is provided a solid-state imaging device, comprising: a semi-conductor substrate demarcating a two-dimensional surface; a multiplicity of photoelectric conversion units formed at grid points of a first grid of a first tetragonal matrix and a second tetragonal matrix having grid points between grid points of the first tetragonal matrix; a vertical transfer channel arranged in a vertical direction by weaving a space between the horizontally adjacent photoelectric conversion units; a plurality of single-layered electrodes formed above the vertical transfer channel and arranged in a horizontal direction by weaving a space between the vertically adjacent photoelectric conversion units; a charge storing unit formed, in correspondence to the vertical transfer channel, at one end of the vertical transfer channel on the semiconductor substrate; and a signal processor having a gate electrode and formed, in correspondence to the vertical transfer channel, at one end of the charge storing unit.

According to further aspect of the present invention, there is provided a manufacturing method for a solid-state imaging device, the method comprising the steps of: (a) preparing a semi-conductor substrate demarcating a two-dimensional surface; (b) forming, in an image area of the semiconductor substrate, a multiplicity of photoelectric conversion units at grid points of a first grid of a first tetragonal matrix and a second tetragonal matrix having grid points between grid points of the first tetragonal matrix; (c) forming a vertical transfer channel arranged in a vertical direction by weaving a space between the horizontally adjacent photoelectric conversion units; and (d) forming a plurality of single-layered electrodes crossing above the vertical transfer channel and extending in a horizontal direction by weaving a space between the vertically adjacent photoelectric conversion units, and forming a gate electrode of a signal processor at one end of the vertical transfer channel in correspondence to the vertical transfer channel.

According to the present invention, a CCD type solid-state imaging device with low power consumption can be provided.

Also, according to the present invention, a CCD type solid-state imaging device with an on-chip peripheral circuit that can be easily manufactured can be provided.

Moreover, according to the present invention, a FIT-CCD type solid-state imaging device that can be easily manufactured and miniaturized can be provided.

DETAILED DESCRIPTION OF THE PREFERRED EMBODIMENTS

Figure 1:
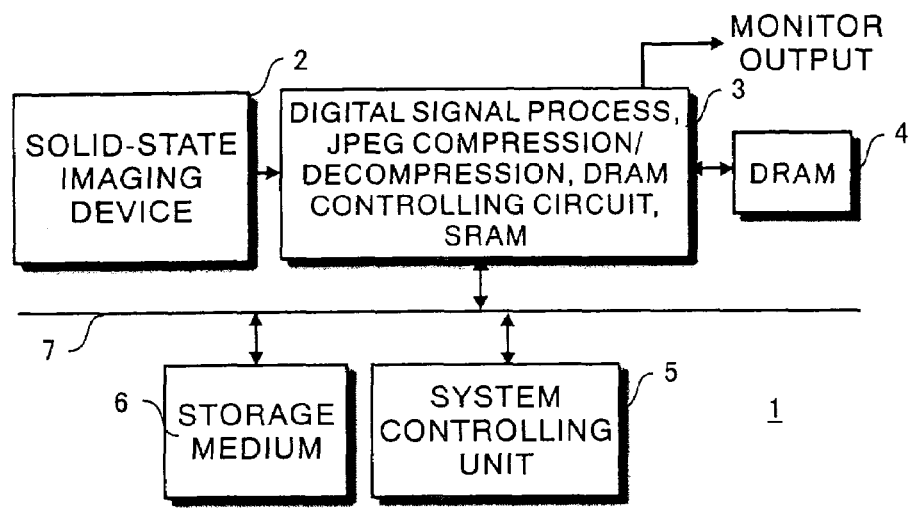
FIG. 1 is a block diagram showing a structure of an imaging system of a digital camera 1 according to a first embodiment of the present invention.

FIG. 1 is a block diagram showing a structure of an imaging system of a digital camera 1 according to a first embodiment of the present invention.

A digital signal processing circuit 3, a system controlling unit 5 and a storage medium 6 are connected to a bus line of the digital camera 1. The digital signal processing circuit is formed by including a JPEG compression/decompression circuit, a DRAM controlling circuit, a DRAM, etc.

The system controlling unit 5 writes digital data output from a solid-state imaging device 2 into the DRAM 4 and afterwards reads the digital data from the DRAM 4 in order to make the digital signal processing circuit 3 perform various image processes such as color conversion, gamma correction, JPEG compression/decompression, etc. Also, the system controlling unit 5 make the digital signal processing circuit 3 output the digital data to which the various imaging processes are performed to a monitor and store the digital data into the storage medium 6 formed of a semiconductor memory, etc. such as a flash memory or the likes. The system controlling unit 5 controls operations of the digital signal processing circuit 3, the storage medium 6 or the likes.

Further, in the embodiments of the present invention, as described in the below, an output of the solid-state imaging device 2 is digital data; therefore, it is not necessary to have an analogue signal processing circuit and ADC outside of the solid-state imaging device 2.

As described in the above, by omitting an analogue signal processing circuit and ADC outside of the solid-state imaging device 2, it is possible to drive a digital camera at lower power consumption comparing to a digital camera using a conventional CCD type solid-state imaging device.

Figure 2:
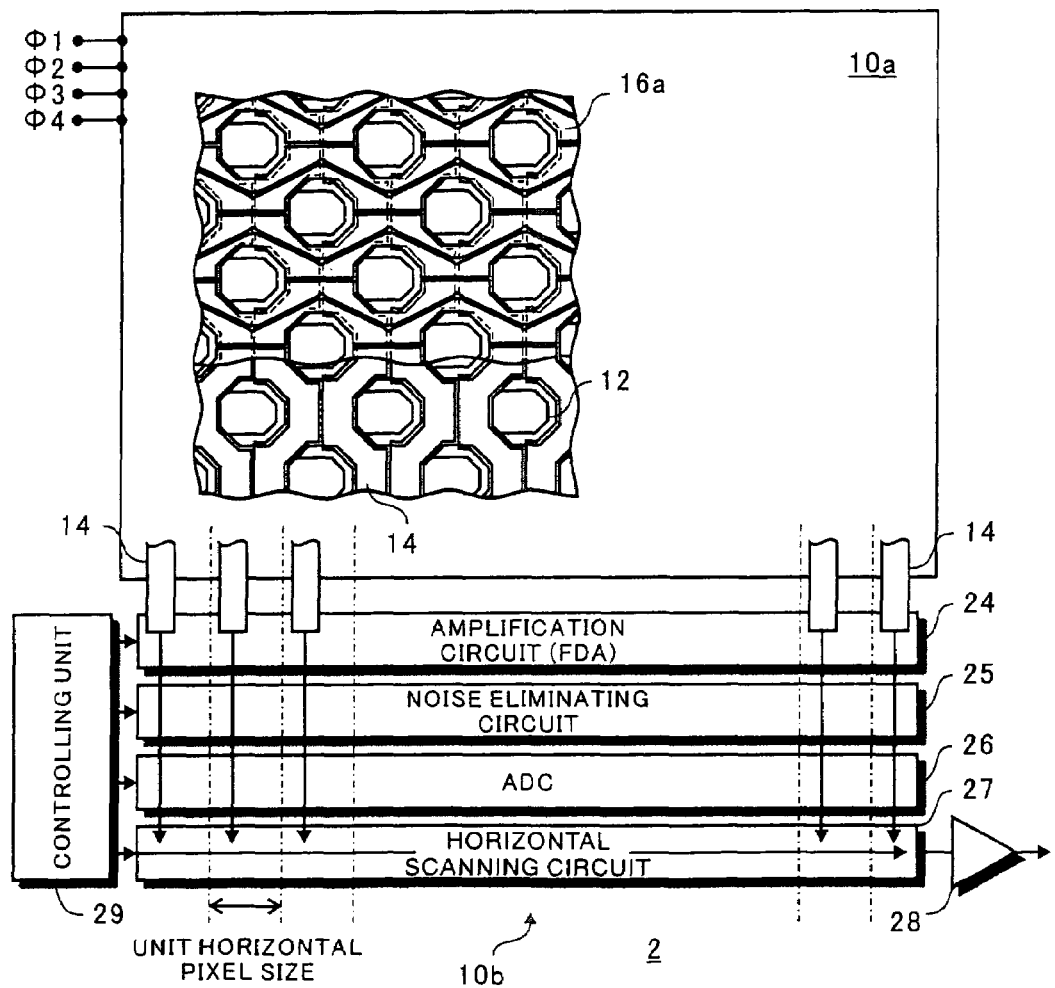
FIG. 2 is a block diagram showing a structure of a solid-state imaging device 2 according to the first embodiment of the present invention.
Figure 3:
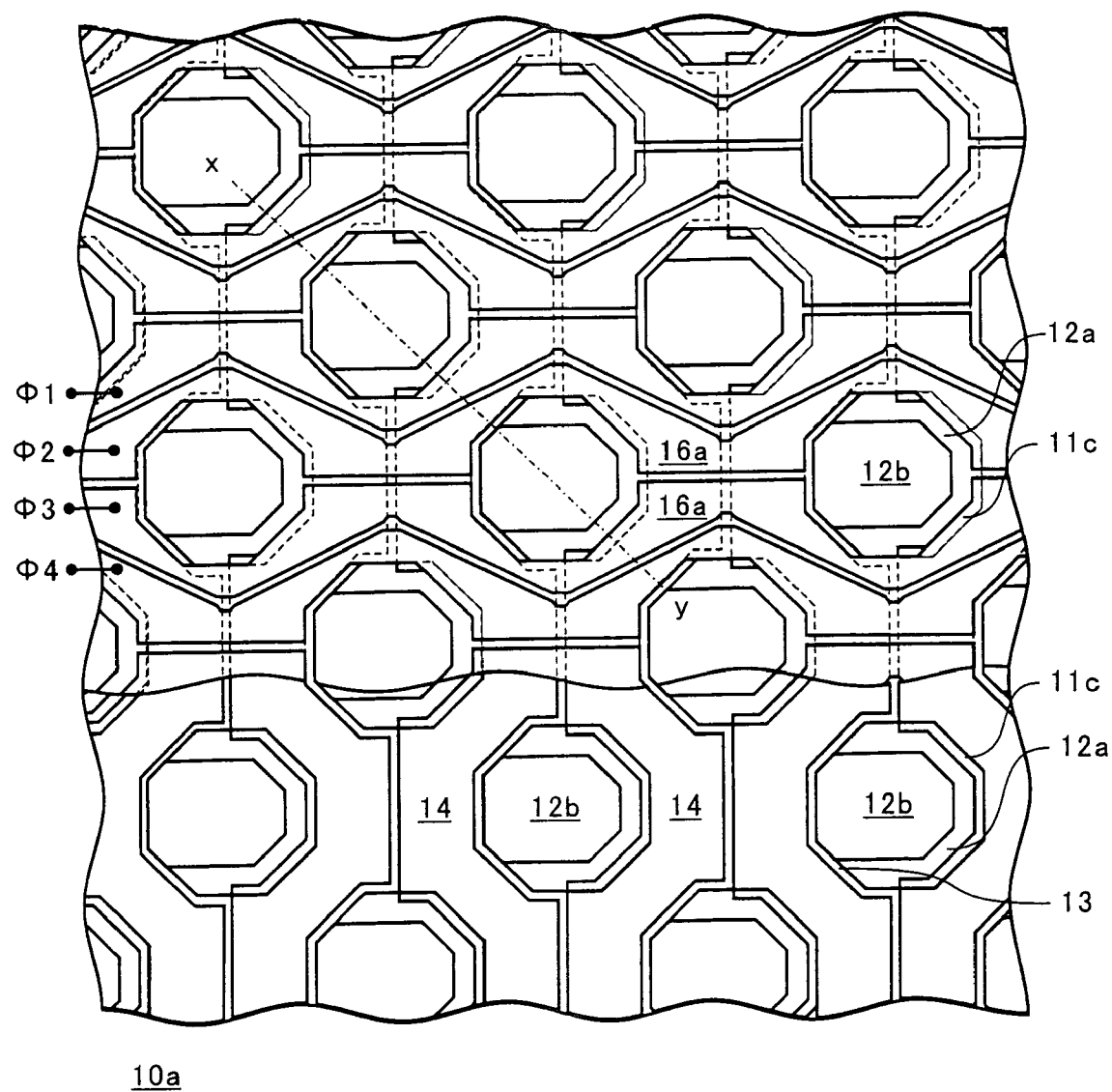
FIG. 3 is an enlarged plan view showing a part of an image area 10a of a solid-state imaging device according to the first embodiment of the present invention.

FIG. 2 is a block diagram showing a structure of a solid-state imaging device 2 according to the first embodiment of the present invention. The drawing shows a condition in which photoelectric conversion units and VCCDs are exposed by removing a part of an insulating film formed on a semiconductor substrate. FIG. 3 is an enlarged plan view showing a part of an image area 10a of a solid-state imaging device according to the first embodiment of the present invention. The solid-state imaging device 2 includes a multiplicity of a photoelectric conversion units (photodiodes) 12n, each consisted of an n-type impurity doped region 12a and a p+-type impurity doped region 12b. The VCCD includes an n-type vertical transfer channel and transfer electrodes 16a formed thereon via an oxide film. In the image area 10a, the multiplicity of the photoelectric conversion units are arranged in rows and columns, and the VCCD is arranged along each column of the photoelectric conversion units.

On the semiconductor substrate outside the image area, the peripheral circuit 10b formed of, for example, a metal oxide semiconductor (MOS) transistor circuit, an output buffer 28 and a controlling unit 29 are formed.

The peripheral circuit 10b includes amplification circuits (FDA) 24, noise eliminating circuits 25, analogue/digital converters (ADC) 26 and horizontal scanning circuits 27. Each amplification circuit (FDA) 24, the noise eliminating circuit 25, the analogue/digital converter (ADC) 26 and the horizontal scanning circuit 27 are configured in correspondence to each vertical transfer channel 14, that is, each column of the photoelectric conversion units 12. Details of the peripheral circuit 10b will be described later with reference to FIG. 4.

The output buffer 28 is a digital amplifier that amplifies the digital data output from the peripheral circuit 10b and outputs to the digital signal processing circuit 3 shown in FIG. 2. The controlling unit 29 controls an operation of the peripheral circuit 10b and supplies a reset signal, a sampling signal, a clump signal, a standard voltage signal, a count value, a horizontal read control signal, etc.

Figure 9:
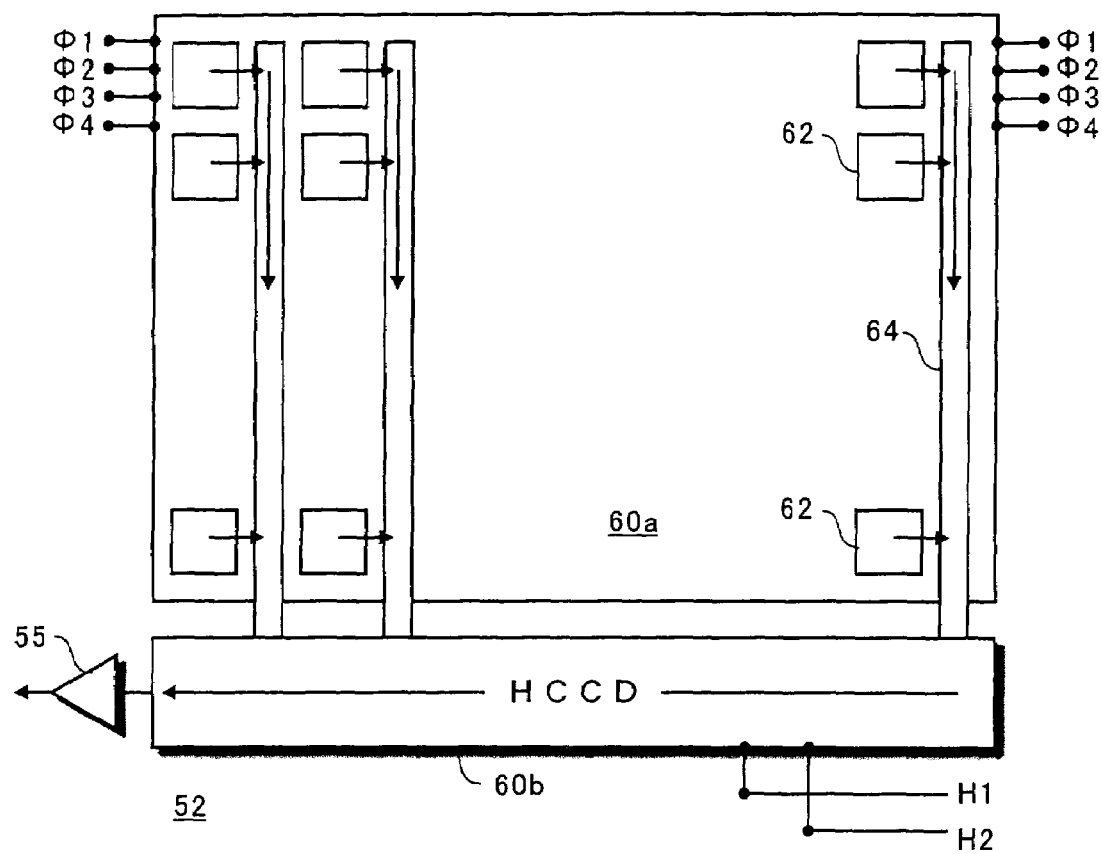
FIG. 9 is a block diagram showing a structure of a CCD type solid-state imaging device 52 according to the prior art.

As described in the above, according to the embodiment of the present invention, analogue signal charges supplied from the image area is converted to digital data in each column of the photoelectric conversion units 12 (the vertical transfer channel 14) by the MOS-type peripheral circuit 10b. By that, the operation speed can be lowered and so power consumption will be lowered. The power consumption of the digital camera 1 can be lowered because a high-speed analogue amplifier (e.g., the output amplifier shown in FIG. 9) that consumes high power will be unnecessary.

Moreover, the power consumption of the digital camera 1 can be further lowered because the high power consuming HCCD (e.g., the HCCD 60b shown in FIG. 9) will be unnecessary by the peripheral circuit 10b supplying the digital output.

A structure of the image area 10a of the solid-state imaging device 2 according to the first embodiment of the present invention will be further explained with reference to FIG. 3.

The image area 10a is formed by arranging the multiplicity of the photoelectric conversion units 12 (each including the n-type impurity doped region 12a and the p+-type impurity doped region 12b) in a so-called "Pixel Interleaved Array." In this specification, the "Pixel Interleaved Array" is an arrangement wherein a first grid of a two-dimensional tetragonal matrix is mixed with a second grid having grid points at the center of the first grid. For example, each of the photoelectric conversion units 12 on even number of columns (rows) is shifted at about ½ of a pitch of the photoelectric conversion units 12 in a direction of the column (row) toward the direction of the column (row) in regard to each of the photoelectric conversion units 12 on odd number of columns (rows). Also, each of photodiodes columns (rows) includes only the photoelectric conversion units 12 on either one of the odd number of column (row) and the even number of column (row). The "Pixel Interleaved Array" is a form of a pixel arrangement wherein multiplicities of photodiodes are arranged in a matrix of a plurality of rows and columns.

Further, the term "about ½" of the pitch includes ½ and, in addition to that, a value that is substantially the same as ½ from a view point of a performance and a quality of picture of a manufactured solid-state imaging device although it is not exactly ½ because of manufacturing error, rounding error of a pixel position occurred by the architecture or masking process, etc. Also, the same concept can be applied to the above-described "about ½ pitch of the photoelectric conversion units 12 on the photodiodes row."

Also, for details of the Pixel Interleaved Array, the entire contents of IEEE, Solid-state Circuit, Vol. 35, No. 12, December 2000, pp 2044-2054 (Yamada, et., al.) are incorporated herein by reference.

Between each of the columns of the photoelectric conversion units 12, the n-type transfer channel region (vertical transfer channel) 14 that reads signal charges generated in the photoelectric conversion units 12 and transfers the signal charges in a vertical direction is formed with slaloming between the columns of the photoelectric conversion units 12 in a vertical direction. The slaloming transfer channels are formed in space regions formed by the pixel interleaved array, and the adjacent transfer channels come closer via the photoelectric conversion units 12 and via the channel stop regions. The photoelectric conversion units 12 and the transfer channels 14 utilize almost all the area of the semiconductor substrate of the image area.

Above the vertical transfer channel 14, with enclosing the later-described insulating film (gate insulating film) 15a, transfer electrodes 16a are formed with slaloming between the rows of the photoelectric conversion units 12 in a horizontal direction. Almost all the areas of the transfer electrodes 16a are configured on the transfer channel 14. In a case of a CCD type solid-state imaging device of the tetragonal matrix, transfer electrodes in a region enclosed by the vertically adjacent photoelectric conversion units do not perform a transfer function but performs just as electrical connectors. On the other hands, in a case of the pixel interleaved array CCD type solid-state imaging device, almost all of the areas of the transfer electrodes perform the transfer function.

The transfer electrodes 16a forms a vertical charge transfer channels (VCCDs) together with the vertical transfer channels 14 and transfers signal charges generated in the photoelectric conversion units 12 in a vertical direction by four-phase driving pulses ($\phi$1-$\phi$4). Each of the transfer electrodes 16a that are driven by the different phase is formed of a single-layered electrode on the same plane via a narrow gap (gap between the transfer electrodes 16a in a direction of the arrangement).

In this specification, the term "single-layered electrode (structure)" is antithesis of the conventional multi-layered poly-silicon electrode (structure) and means a structure in which a plurality of electrodes are configured via narrow gaps on the same plane without overlapping each another at the edges of the electrodes. Therefore, in this specification, the term "single-layered electrode (structure)" includes not only an electrode made of single metal material (e.g., tungsten (W)) or the likes but also a laminated structure of metals such as tungsten silicide, poly-silicon and tungsten, etc. Moreover, the term "single-layered electrode" includes an electrode made of a plurality of metal materials laminated preferably without an inter-layer insulating film.

Figure 10:
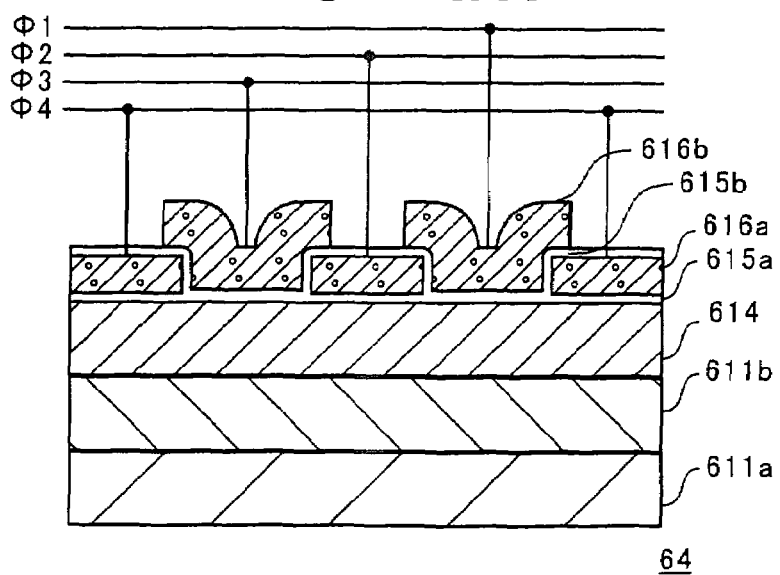
FIG. 10 is a schematic cross sectional view showing a structure of a multi-layered electrode structure according to the prior art.
Figure 11:
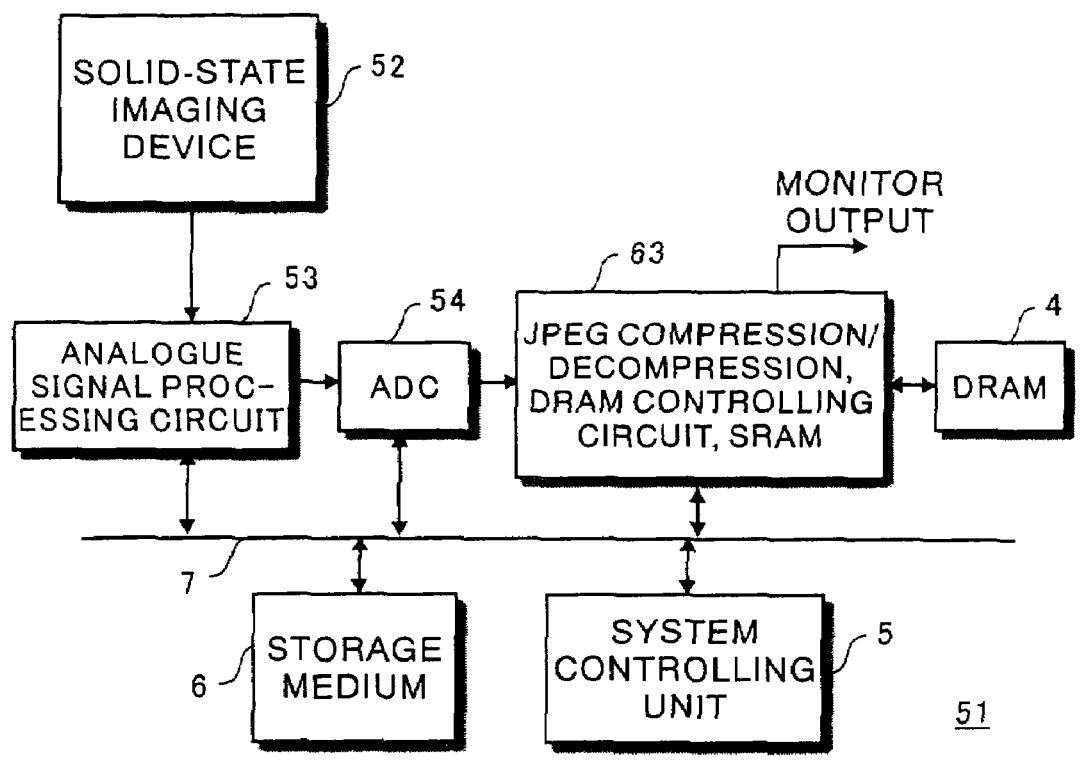
FIG. 11 is a block diagram showing a structure of an imaging system of a digital camera using a solid-state imaging device according to the prior art.

As described in the above, by making the transfer electrodes 16a the single-layered electrodes, it will be unnecessary to form the inter layer insulating film 615b (FIG. 10) that are formed between layers in the multi-layered electrode structure. Moreover, all of the transfer electrodes can be formed at a mean time on the oxide film (oxide film 15a shown in FIG. 5) formed on the semiconductor substrate; therefore, difference in film thickness can be greatly restrained. In addition to that, the film thickness of the oxide film itself can be thin and driving voltage of the electrodes can be lowered. Also, overlapping of the electrodes can be eliminated; therefore, stray capacitance can be lowered. As a result, power consumption can be lowered at about 20% comparing to the conventional CCD type solid-state imaging device using the multi-layered electrodes.

Moreover, in this embodiment, because the photoelectric conversion units 12 are arranged in the pixel interleaved array, almost all the peripheral regions of the photoelectric conversion units 12 can be used as the vertical transfer channels 14 as shown in FIG. 3. Therefore, so-called "invalid regions" hardly exist. Therefore, according to this embodiment, a plurality of the transfer electrodes 16a formed on the same plane do not interfere the area of the light receiving area (the photoelectric conversion units 12).

In other words, in a combination of the photoelectric conversion units in the tetragonal matrix and the single-layered electrodes increases areas of wirings between the vertically adjacent photoelectric conversion units; however, according to this embodiment, such a loss does not exist.

Further, details of a structure and a manufacturing method of a solid-state imaging device having the single-layered electrode structure are described in the preferred embodiments of Japanese Patent Application No. 2000-383922, filed on Dec. 18, 2000, by the same applicant as the present invention. For example, gaps between the electrodes can be narrow by forming a single-layered electrode film, patterning the film to form separated electrodes, thereafter depositing a further thinner conductive layer and remaining the conductive layer only on the side wall of the electrodes by patterning with anisotropic etching. The electrode layer may be made of polycrystalline silicon or metal. Also, the conductive layer deposited thereafter may be metal or polycrystalline silicon or metal if the CVD growth is possible.

Figure 4:
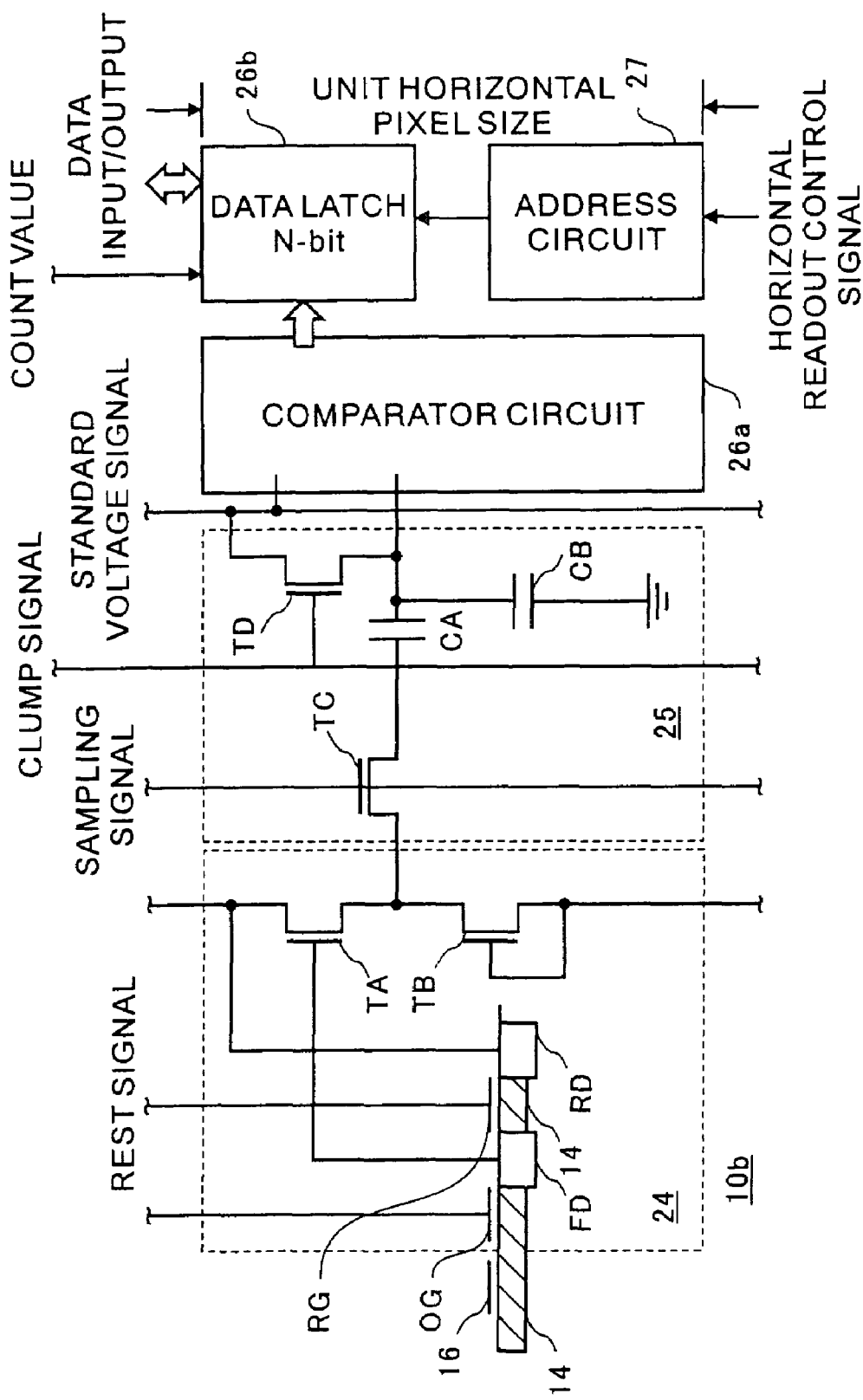
FIG. 4 is a block diagram showing an example of a structure of a peripheral circuit (CMOS circuit) 10b according to the first embodiment of the present invention.

FIG. 4 is a block diagram showing an example of a structure of a peripheral circuit (CMOS circuit) 10b according to the first embodiment of the present invention. The same reference numbers as in FIG. 2 and FIG. 3 indicate substantially same parts.

The peripheral circuit 10b is prepared for every column of image area 10a corresponding to each of the vertical transfer channels 14, and the width of each peripheral circuit 10b is below the horizontal size (unit horizontal pixel size) of each photoelectric conversion units 12. Within this unit horizontal pixel size, the amplification circuit (FDA) 24, the noise eliminating circuit 25, the analogue/digital converter (ADC) 26 containing a comparator circuit 26a, and a data latch 26b, and a address circuit (or horizontal scanning circuit) 27 are integrated on the same chip.

The FDA 24 is a charge/voltage (Q/V) converter consisted of a floating diffusion amplifier (FDA) and a source follower circuit, and converts signal charges supplied from the vertical transfer channel 14 of the image area 10a into analogue voltage signal.

An output gate OG is formed adjoining the edge of the vertical transfer channel 14. Further a floating diffusion FD, an n-region, is formed adjoining the edge of the vertical transfer channel 14. Also, adjoining the floating diffusion FD, an n-type region 14 and thereon a reset gate RG are formed. A reset signal is supplied to the reset gate RG from the controlling unit 29 (FIG. 2). When the n-type region below the output gate OG and the reset gate RG is depleted by impressing negative voltage to the output gate OG and the reset gate RG, the floating diffusion FD becomes in a state of electrically floating.

The floating diffusion FD is connected to a gate of an output MOS transistor TA. A reset drain RD is connected to a drain side of the transistor TA. Also, a source of the transistor TA is connected to a drain side of a load MOS transistor TB.

The load MOS transistor TB performs a same function as a resistor and forms a source follower circuit of the transistor TA by grounding the gate and the source.

The FDA 24, with the above-described structure, converts signal charges supplied from the vertical transfer channel 14 of the image area 10a into analogue voltage signal and supplies the converted signals to the following noise eliminating circuit 25.

The noise eliminating circuit 25 is, for example, a correlated double sampling circuit and, as shown in the drawing, is consisted of a sampling MOS transistor TC, a sampling condenser CA, a clump transistor TD and a clump condenser CB. To a gate of the transistor TC, sampling signals are supplied from the controlling unit 29. To a gate of the transistor TD, clump signals and to a drain, standard voltage is supplied from the controlling unit 29.

The noise eliminating circuit 25 stores standard voltage supplied from the controlling unit 29 in accordance with timings of clump signals into the condenser CB and clumps field through levels of the supplied analogue voltage signals. Difference between sampled analogue voltage signal and the clumped field through level is supplied to the comparison circuit 26a. 1/f noise and reset noise of the analogue voltage signal are lowered by passing through the noise eliminating circuit 25.

The comparison circuit 25a forms the ADC 26 together with the data latch 26b and converts the supplied analogue voltage signals into digital data. The comparison circuit 25a compares the analogue voltage signal supplied from the noise eliminating circuit 25 and the standard voltage signal supplied from the controlling unit 29 to detect a zero level wherein a level difference of both signals disappears. The comparison circuit 25a outputs a latch signal to the data latch 26b when the zero level is detected. A count value is supplied to the data latch 26b from the controlling unit 29. The count value is started to be counted from the starting point of variation of the standard voltage signal and is in proportion to the analogue signal. That is, the count value at the time of detecting the zero level represents digital data corresponding to the supplied analogue voltage signal.

The address circuit 27 generates and supplies an address signal to the data latch 26b in accordance with a horizontal read controlling signal supplied from the controlling unit 29. The data latch 26b outputs contents (digital data) of memory at an address corresponding to the address signal to the output buffer 28 (FIG. 2).

The peripheral circuit 10b may be formed based on the disclosure in the preferred embodiments of the Japanese Patent Application No. 2000-343441, filed by the same applicant as the present invention.

The solid-state imaging device 2 according to the embodiment and manufacturing method of that will be explained below with reference to FIG. 5 and FIG. 6.

Figure 5:
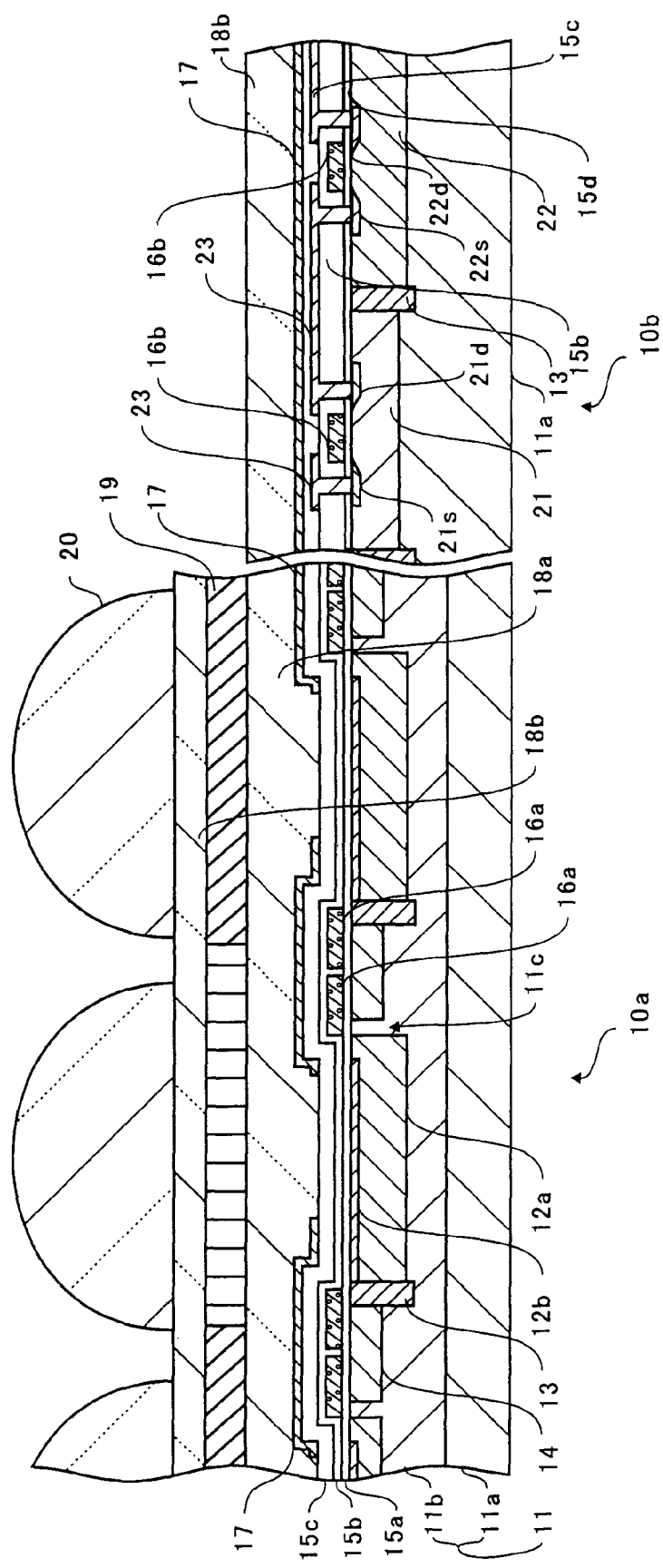
FIG. 5 is an enlarged cross sectional view of the solid-state imaging device 2 according to the first embodiment of the present invention.
Figure 6:
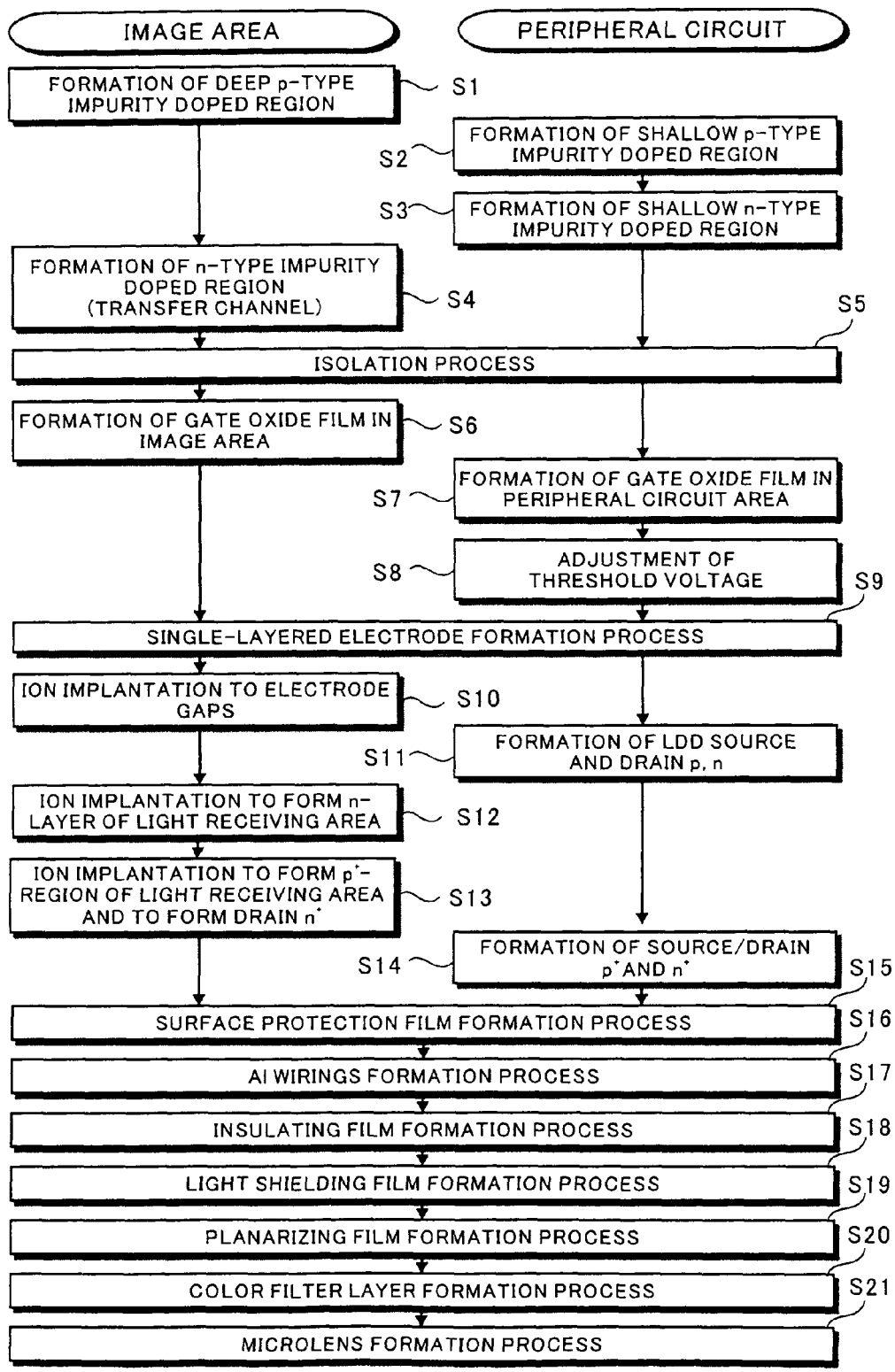
FIG. 6 is a flow chart showing a manufacturing process of the solid-state imaging device 2 according to the first embodiment of the present invention.

FIG. 5 is an enlarged cross sectional view of the solid-state imaging device 2 according to the first embodiment of the present invention. In the drawing, the left side shows the image area 10a cut along with a line x-y in FIG. 3, and the right side shows an example of the peripheral circuit 10b. The same reference numbers as in FIGS. 2 to 4 indicate the substantially same parts. FIG. 6 is a flow chart showing a manufacturing process of the solid-state imaging device 2 according to the first embodiment of the present invention.

In the following explanation, in order to distinguish impurity concentrations of impurity doped regions having the same conductive type, it is expressed as follows (from relatively lower concentration to higher concentration of impurities): p$^-$-type impurity doped region, p-type impurity doped region, and p$^+$-type impurity doped region, or n$^-$-type impurity doped region, n-type impurity doped region, and n$^+$-type impurity doped region. Except forming a p$^-$-type impurity doped region 11b by an epitaxial growth method, all of the impurity doped regions are preferably formed by an ion implantation and a thermal process performed thereafter.

A semiconductor substrate 11 has, for example, an n$^-$-type silicon substrate 11a and a p$^-$-type impurity doped region 11b formed in a surface of its image area 10a.

At Step S1, the p$^-$-type impurity doped region 11b is formed by ion implantation of p-type impurities into a surface of the n$^-$-type silicon substrate 11a and a thermal process performed thereafter, or by an epitaxial growth of silicon containing p-type impurities onto a surface of the n$^-$-type silicon substrate 11a.

At Step S2, a shallow p-type impurity doped region 21 for an n-MOS transistor is formed in a peripheral circuit area 10b of the semiconductor substrate 11.

At Step S3, a shallow n-type impurity doped region 22 for a p-MOS transistor is formed.

At Step S4, corresponding to each column of photoelectric conversion units formed at the later-described Step S12 and Step S13, an n-type impurity doped region (vertical transfer channel) 14 is formed in the p$^-$-type impurity doped region 11b. Each vertical transfer channel 14 has almost the same impurity concentration over the total length, and extends along with the corresponding column of the photoelectric conversion units.

At Step S5, channel stop regions 13 are formed in surrounding areas, in a plan view, of the photoelectric conversion units 12 and the vertical transfer channels 14 except area for forming readout gate channel regions 11c and in surrounding areas of the p-type impurity doped region 21 and the n-type impurity doped region 22 of the peripheral circuit area 10b. The channel stop regions 13 is, for example, formed of the p$^+$-type impurity doped region, trench isolations, or local oxidation of silicon (LOCOS). The isolations of the image area 10a and the peripheral circuit area 10b are performed in the same process as describe above.

A part of a p-type impurity doped region 11c is remained along with right side edge of each photoelectric conversion unit 12 (n-type impurity doped region 12a). A column wise length of the p-type impurity doped region 11c is, for example, about a half of a column wise length of the corresponding photoelectric conversion unit 12. Each p-type impurity doped region 11c is used as the readout gate channel region 11c.

At Step S6, an oxide film 15a is formed on a surface of the image area 10a of the semiconductor substrate 11. At Step S7, a gate oxide film 15d having a thickness thinner than the oxide film 15a is formed. When the oxide films are formed in the same process, the number of processes can be decreased. When selecting optimal thickness suited for a CCD and a MOS transistor, different oxide films can be formed. For example, by forming an oxide film all over the surface, removing a part of the oxide film and forming further oxide film, the oxide film having different thickness can be formed.

Further, for example, a thermal oxide film as the oxide film 15a may be arranged on each photoelectric conversion unit 12, and an oxide nitride oxide (ONO) film as the oxide film 15a may be arranged on other areas in the image area 10a except areas on the photoelectric conversion units 12.

For example, the above-described ONO film is formed of a laminated film sequentially depositing a silicon oxide film (thermal oxide film) in thickness about 20 to 70 nm, a silicon nitride film in thickness about 20 to 80 nm and a silicon oxide film in thickness about 10 to 50 nm. In FIG. 5, for convenience of the explanation, one layer represents the oxide film 15a.

At Step S8, threshold voltages are adjusted by ion implantation to surfaces of the p-type impurity doped region 21 and the n-type impurity doped region 22.

At Step S9, common single-layered electrodes formation process of the image area 10a and the peripheral circuit area 10b is performed. At this process, transfer electrodes 16a and gate electrodes 16b are formed on a gate insulation films 15a and 15d, respectively. In this embodiment, transfer electrodes 16a are made into the single-layered electrode structure by carrying out a plurality (for example, two) of the electrodes being arranged on the same plane with a narrow gap.

Thus, by making transfer electrodes 16a into the single-layered electrode structure, inter-layer insulating film arranged between layers in the multi-layered electrode structure can become unnecessary, and a capacitive component can be reduced as compared with the multi-layered electrode structure. Therefore, the driving voltage of the VCCD falls and power consumption is reduced.

Moreover, by making transfer electrodes 16a into the single-layered electrode structure like the gate electrodes 16b used by the peripheral circuit area 10b, it becomes possible to form both at the same process using the same material, and it becomes easy to form the image area 10a and the peripheral circuit area 10b on the same semiconductor substrate 11.

The transfer electrodes 16a and the gate electrodes 16b are formed of, for example, tungsten (W), a polycide film of low resistance poly-silicon and tungsten silicide (WSi), etc. In addition, for example, molybdenum (Mo), tungsten silicide (WSi), molybdenum silicide (MoSi), titan silicide (TiSi), tantal silicide (TaSi), copper silicide (CuSi), etc. can be used as electrode material. Moreover, transfer electrodes 16a and the gate electrodes 16b may be formed by laminating such electrode material without using an inter-layer insulating film.

In order to make flows of electric charges smooth, as for the narrow gap prepared in the orientation of transfer electrodes 16a, a width of the gap is preferable to be about 0.3 micrometers or less, and more preferably to be about 0.1 micrometers to 0.2 micrometers.

At Step S10, ion implantation is performed to the above-described narrow gaps. By ion implanting p-type impurities into an n-type channel region, potential barriers will be lowered or can be eliminated.

At Step S11, a shallow n-type region is formed in the p-type impurity doped region 21 by ion implantation, and a shallow p-type region is formed in the n-type impurity doped region 22 by ion implantation. Thus, in a shallow area near the gate electrode 16b, lightly doped drains (LDD) or extensions are formed.

At Step S12, predetermined parts of the $p^-$-type impurity doped region 11b is converted to n-type impurity doped regions 12a by ion implantation. Further, each n-type impurity doped region 12a functions as a charge-storing region.

At Step S13, by converting an outer-most surface of each n-type impurity doped region 12a converted at Step S12 into a $p^+$-type impurity doped region 12b, the photoelectric conversion units 12 that are implanted photodiodes are formed. Also, $n^+$-type drain regions are formed by ion implantation.

At Step S14, an $n^+$-type source region 21s and an $n^+$-type drain region 21d are formed in the p-type impurity doped region 21 formed at Step S11, and a $p^+$-type source region 22s and a $p^+$-type drain region 22d are formed in the n-type impurity doped region 22 formed at Step S11. The $n^+$-type source region 21s and the $n^+$-type drain region 21d and the $p^+$-type source region 22s and the $p^+$-type drain region 22d are respectively formed in the shallow n-type region in the p-type impurity doped region 21 and in the shallow p-type region in the n-type impurity doped region 21 formed at Step S11 by implanting further impurities of the same conductivity types. Theses regions respectively function as the n-MOS transistor and the p-MOS transistor together with the gate electrodes 16b formed at Step S9.

At Step S15, a surface protection film 15b is formed to cover the photoelectric conversion units 12, the transfer electrodes 16a, the gate electrodes 16b, etc.

At Step S16, aluminum wirings 23 for the $n^+$-type source region 21s, the $n^+$-type drain region 21d, the $p^+$-type source region 22s and the $p^+$-type drain region 22d of the peripheral circuit area 10b are formed.

At Step S17, an insulating film 15c is formed on the surface protection film 15b to cover the aluminum wirings 23. The surface protection film 15b and the insulating film 15c electrically isolate the later-described light shielding film 17 and the various electrodes formed below sufficiently. The surface protection film 15b and the insulating film 15c are formed by depositing, for example, silicon oxide by physical vapor deposition (hereinafter called PVD) or chemical vapor deposition (hereinafter called CVD).

At Step S18, a light shielding film 17 is formed by depositing a metal such as tungsten, aluminum, chromium, titan, molybdenum, etc., or an alloy made of two or more than two of such metals by the PVD or the CVD. This light shielding film 17 covers each transfer channel 16a and the peripheral circuit area 10b in a plan view in order to prevent unnecessary photoelectric conversion in areas other than the photoelectric conversion units 12.

This light shielding film 17 has openings, each of which corresponds to and is formed above the photoelectric conversion units 12 each one of the photoelectric conversion units 12 in order to permit light to irradiate to the photoelectric conversion units 12. An area of a surface of each photoelectric conversion unit 12 positioned, in a plan view, within the opening will be a light irradiating surface of the photoelectric conversion unit 12.

At Step S19, a common first planarizing layer 18a containing a passivation layer and a planarizing insulating layer is formed on the light shielding film 17 on the surfaces of the image area 10a and the peripheral circuit area 10b.

At Step S20, a color filter layer 19 is formed by, for example, sequentially forming resin (colored resin) layers colored with three or four different colors on predetermined positions by photolithography or the likes. The color filter layer 19 is mainly configured in a solid-state imaging device used in a single CCD color imaging device. The color filter layer 19 can be omitted in a monochrome solid-state imaging device and a solid-state imaging device for a three-CCD color imaging device.

At Step S21, for example, a transparent resin layer is formed on a second planarizing layer 18b. The transparent resin layer is patterned into a predetermined shape by photolithography or the like. Thereafter, the patterned transparent resin layer is re-flowed to form microlenses 20. The second planarizing layer 18b is formed on the color filter layer 19 and provides planarized surface for forming the microlenses 20. The second planarizing layer 18b is made of, for example, organic material such as photoresist to the likes as similar to the first planarizing layer 18a. On the upper surface of the second planarizing layer 18b, the microlenses 20, each of which is corresponding to each one of the photoelectric conversion units 12, are formed.

Figure 7:
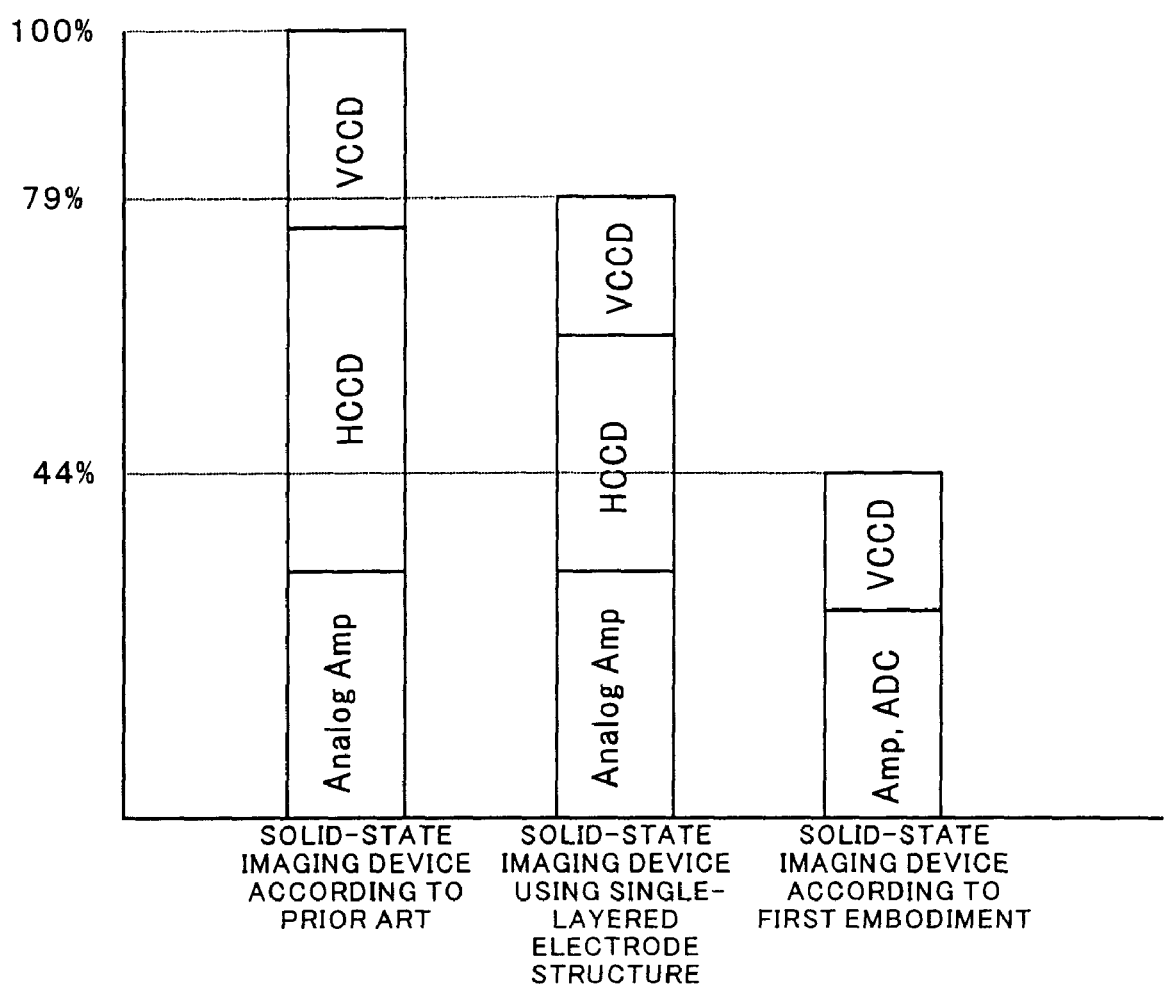
FIG. 7 is a bar graph showing a power consumption of the solid-state imaging device 2 according to the first embodiment of the present invention.

FIG. 7 is a bar graph showing a power consumption of a CCD type charge transfer channel and an analogue amplifier and an analogue to digital converter of the solid-state imaging device 2 according to the first embodiment of the present invention. In the drawing, a graph on a left side shows power consumption of a CCD type solid-state imaging device using the multi-layered electrodes according to the prior art, a graph on a center shows a power consumption of a CCD type solid-state imaging device using the single-layered electrodes, and a graph on a right side shows a power consumption of the solid-state imaging device 2 according to the first embodiment of the present invention.

As described in the above, the power consumption of the HCCD (e.g., HCCD 60b in FIG. 9) and the high-speed amplifier (e.g., the output amplifier 55 in FIG. 9) of the conventional CCD type solid-state imaging device count about 80% of the total power consumption.

Also, when the transfer electrodes 14 are made into the single-layered structure (the graph on the center), they can be driven by lower voltage (about 15% to 20% lower) comparing to the conventional CCD type solid-state imaging device made into the multi-layered electrode structure; therefore, the total power consumption is lowered by about 20% comparing to the conventional CCD type solid-state imaging device made into the multi-layered electrode structure.

According to the solid-state imaging device 2 according to the first embodiment of the present invention, instead of using the HCCD and the high-speed amplifier, the on-chip peripheral circuit 10b performs amplification and A/D conversion every column of the photoelectric conversion units 12; therefore, the total power consumption is lowered by about ½ comparing to the conventional CCD type solid-state imaging device made into the multi-layered electrode structure. Moreover, in the solid-state imaging device 2 according to the first embodiment, the transfer electrodes 14 are made into the single-layered structure in addition to omitting the HCCD and the high-speed amplifier; therefore, further lower power consumption is achieved comparing to the case of just making the transfer electrodes 14 into the single-layered structure.

Further, the solid-state imaging device 2 according to the first embodiment is equipped with the peripheral circuit 10b including the ADC 26, etc. and so external high-speed ADC or analogue signal processing circuit are unnecessary. Considering that, as a whole system of the digital camera 1, it is possible to reduce the total power consumption by about ⅓ or lower comparing to a total power consumption of an imaging system (up to formation of digital output) of the conventional digital camera 51 including the conventional CCD solid-state imaging device 52, the analogue signal processing circuit 553 and the ADC 54.

As described in the above, according to the first embodiment of the present invention, by making the transfer electrodes 14 into the single-layered electrode structure, driving voltage of the VCCD can be lowered. Therefore, power consumption of the VCCD can be lowered.

Further, according to the first embodiment of the present invention, the transfer electrodes 14 and the gate electrodes of the peripheral MOS circuit can be formed of common single-layered (metal) electrodes. Therefore, the transfer electrodes 14 and the gate electrodes of the peripheral MOS circuit can be formed at the same manufacturing process, and an on-chip peripheral circuit can be easily achieved.

Moreover, according to the first embodiment of the present invention, the electrical isolation of the image area 10a and the peripheral circuit area 10b can be performed at a same process.

Therefore, a CCD type image area and a CMOS peripheral circuit can be combined by the simple process. Thus, a high power consuming HCCD can be omitted and so, with keeping features of a CCD type solid-state imaging device, low power consumption, the feature of a CMOS peripheral circuit, can be utilized.

Further, a high power consuming wide range analogue output amplifier is unnecessary because the solid-state imaging device 2 according to the first embodiment amplifies analogue signals and converts them into digital signals by every columns of the photoelectric conversion units 12.

Also, according to the first embodiment of the present invention, the peripheral circuit 10b of the solid-state imaging device 2 has an ability of digital output; therefore, mixing of noise, etc. caused by analogue output can be prevented. Moreover, the solid-state imaging device 2 is equipped with the built-in analogue/digital converter 26; therefore, an external fast ADC can be omitted. Further, by performing digital output, an external analogue signal processing circuit is also unnecessary.

Figure 8:
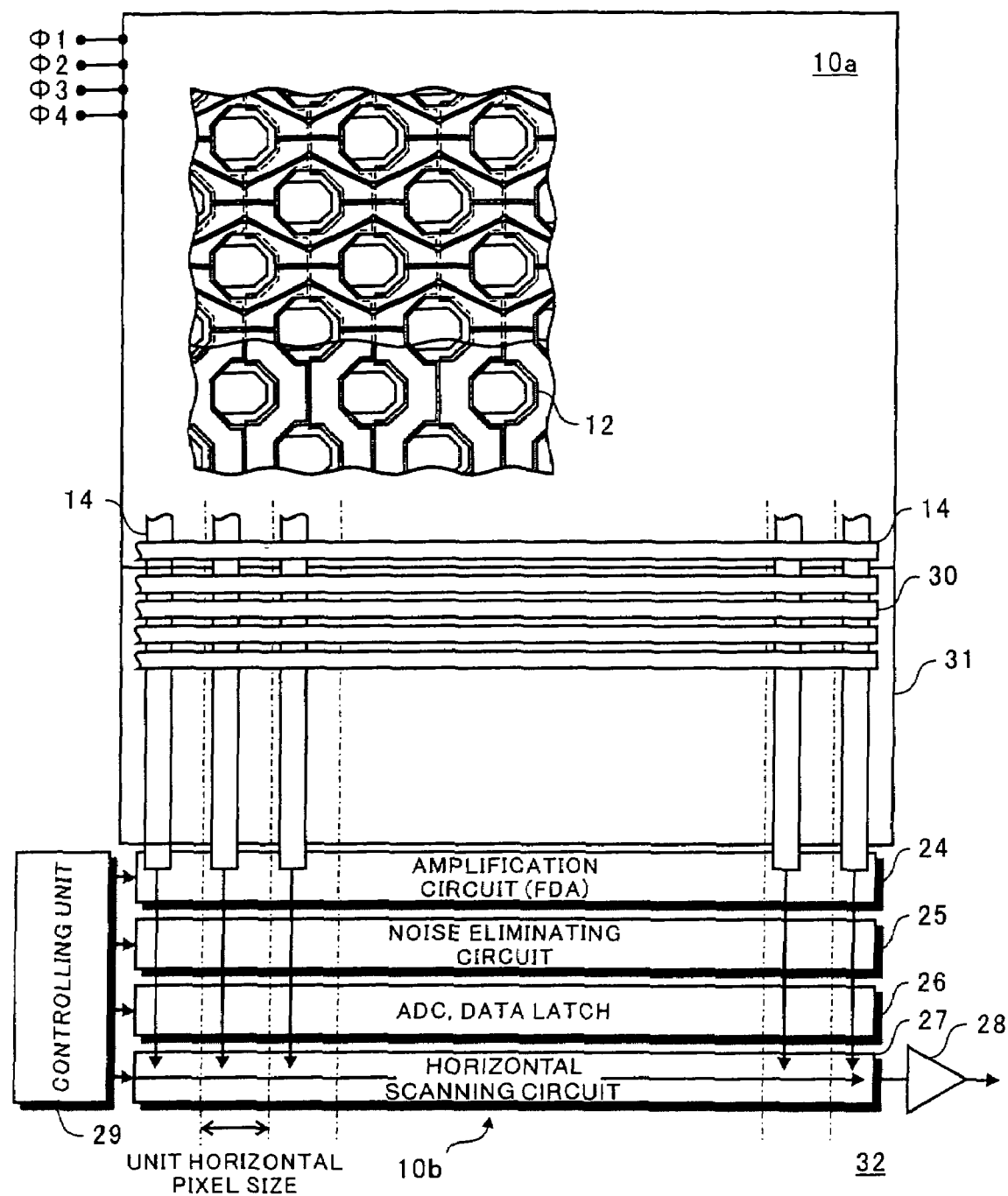
FIG. 8 is a block diagram showing a structure of a solid-state imaging device 2 according to a second embodiment of the present invention.

FIG. 8 is a block diagram showing a structure of a solid-state imaging device 2 according to a second embodiment of the present invention. Further, explanations for the substantially same parts as in the first embodiments will be omitted by indicating the parts with the same reference numbers.

In this second embodiment, a signal charge storing unit 31 is formed between the image area 10a and the peripheral circuit 10b according to the first embodiment for making it into so-called frame interline transfer (FIT)-CCD.

This second embodiment uses single-layered metal electrodes 30 that are the same as the transfer electrodes 14 of the image area 10a; therefore, high-speed charge transfer is easily performed. Also, because an HCCD and a high-speed amplifier are not used, power consumption can be lowered and it makes the solid-state imaging device according to the second embodiment low power consuming FIT-CCD.

Thus, according to the second embodiment of the present invention, in addition to the above-described first embodiment, it is possible to provide a high speed vertical charge transfer and low power consuming FIT-CCD featuring low smear noise.

The present invention has been described in connection with the preferred embodiments. The invention is not limited only to the above embodiments. It is apparent that various modifications, improvements, combinations, and the like can be made by those skilled in the art.

What are claimed are:

1. A solid-state imaging device, comprising:
   a semi-conductor substrate demarcating a two-dimensional surface;
   a multiplicity of photoelectric conversion units formed at grid points of a first grid of a first tetragonal matrix and a second tetragonal matrix having grid points between grid points of the first tetragonal matrix;
   a vertical transfer channel arranged in a vertical direction by weaving a space between the horizontally adjacent photoelectric conversion units;
   a plurality of single-layered electrodes formed above the vertical transfer channel and arranged in a horizontal direction by weaving a space between the vertically adjacent photoelectric conversion units, wherein each single-layered electrode does not overlap with adjacent single-layered electrodes and has a gap with each of the adjacent single-layered electrodes; and
   a signal processor having a gate electrode and formed, in correspondence to the vertical transfer channel, at one end of the vertical transfer channel on the semiconductor substrate, wherein the gate electrode is made of a same electrode material as the single-layered electrode and is formed on a same layer as the single-layered electrode.

2. A solid-state imaging device according to claim 1, wherein the signal processor is a CMOS circuit.

3. A solid-state imaging device according to claim 1, wherein the single-layered electrodes and the gate electrode are made of tungsten (W), a polycide film of low resistance poly-silicon and tungsten silicide (WSi) molybdenum (Mo), tungsten silicide (WSi), molybdenum silicide (MoSi), titanium silicide (TiSi), tantal silicide (TaSi), or copper silicide (CuSi).

4. A solid-state imaging device, comprising:
 a semi-conductor substrate demarcating a two-dimensional surface;
 a multiplicity of photoelectric conversion units formed at grid points of a first grid of a first tetragonal matrix and a second tetragonal matrix having grid points between grid points of the first tetragonal matrix;
 a vertical transfer channel arranged in a vertical direction by weaving a space between the horizontally adjacent photoelectric conversion units;
 a plurality of single-layered electrodes formed above the vertical transfer channel and arranged in a horizontal direction by weaving a space between the vertically adjacent photoelectric conversion units, wherein each single-layered electrode does not overlap with adjacent single-layered electrodes and has a gap with each of the adjacent single-layered electrodes;
 a charge storing unit formed, in correspondence to the vertical transfer channel, at one end of the vertical transfer channel on the semiconductor substrate; and
 a signal processor having a gate electrode and formed, in correspondence to the vertical transfer channel, at one end of the charge storing unit, wherein the gate electrode is made of a same electrode material as the single-layered electrode and is formed on a same layer as the single-layered electrode.

5. A solid-state imaging device according to claim 4, wherein the signal processor is a CMOS circuit.

6. A solid-state imaging device according to claim 4, wherein the single-layered electrodes and the gate electrode are made of tungsten (W), a polycide film of low resistance poly-silicon and tungsten silicide (WSi) molybdenum (Mo), tungsten silicide (WSi), molybdenum silicide (MoSi), titanium silicide (TiSi), tantal silicide (TaSi), or cooper silicide (CuSi).

7. A manufacturing method for a solid-state imaging device, the method comprising the steps of:
 (a) preparing a semi-conductor substrate demarcating a two-dimensional surface;
 (b) forming, in an image area of the semiconductor substrate, a multiplicity of photoelectric conversion units at grid points of a first grid of a first tetragonal matrix and a second tetragonal matrix having grid points between grid points of the first tetragonal matrix;
 (c) forming a vertical transfer channel arranged in a vertical direction by weaving a space between the horizontally adjacent photoelectric conversion units; and
 (d) forming a plurality of single-layered electrodes crossing above the vertical transfer channel and extending in a horizontal direction by weaving a space between the vertically adjacent photoelectric conversion units and by arranging each single-layered electrode to have a gap with each of adjacent single-layered electrodes without overlapping with the adjacent single-layered electrodes, and simultaneously forming a gate electrode of a signal processor at one end of the vertical transfer channel in correspondence to the vertical transfer channel, wherein the single-layered electrodes and the gate electrode are made of a same electrode material and the gate electrode is formed on a same layer as the single-layered electrodes.

8. A manufacturing method according to claim 7, further comprising the step of (e) performing an isolation process to the image area and the signal processor.

* * * * *